United States Patent [19]

Wakamiya et al.

[11] Patent Number: 5,357,304
[45] Date of Patent: Oct. 18, 1994

[54] IMAGE DEVELOPMENT APPARATUS AND METHOD

[75] Inventors: Kiyotaka Wakamiya; Yuuichi Aki, both of Tokyo; Minoru Inagaki, Kanagawa, all of Japan

[73] Assignee: Sony Corporation, Tokyo, Japan

[21] Appl. No.: 35,251

[22] Filed: Mar. 22, 1993

[30] Foreign Application Priority Data

Mar. 25, 1992 [JP] Japan .................................. 4-066518
Mar. 25, 1992 [JP] Japan .................................. 4-066519

[51] Int. Cl.$^5$ ...................... G03D 13/00; G03D 5/00
[52] U.S. Cl. .................................... 354/298; 354/317
[58] Field of Search ............... 354/317, 298, 325, 324, 354/334; 156/626, 627, 656, 657; 204/192.33; 250/571, 559; 134/56 R, 18, 57 R, 1, 113, 140, 149, 151; 430/30

[56] References Cited

U.S. PATENT DOCUMENTS

| | | |
|---|---|---|
| 4,136,940 | 1/1979 | Lin ........................................ 354/298 |
| 4,142,107 | 2/1979 | Hatzakis et al. ...................... 250/571 |
| 4,462,860 | 7/1984 | Szmanda ............................... 156/626 |
| 4,469,424 | 9/1984 | Matsui et al. ........................ 354/298 |
| 4,501,480 | 2/1985 | Matsui et al. ........................ 354/298 |
| 4,569,717 | 2/1986 | Ohgami et al. ....................... 156/626 |
| 4,647,172 | 3/1987 | Batchelder et al. .................. 354/298 |
| 4,857,430 | 8/1989 | Millis et al. ........................... 354/298 |
| 4,998,021 | 3/1991 | Mimasaka ............................. 250/560 |
| 5,131,752 | 7/1992 | Yu et al. ............................... 356/369 |

FOREIGN PATENT DOCUMENTS

| | | |
|---|---|---|
| 2598508 | 11/1987 | France . |
| 62-063430 | 3/1987 | Japan . |
| 1162254 | 6/1989 | Japan . |
| 1286142 | 11/1989 | Japan . |
| 1298356 | 12/1989 | Japan . |
| 2125764 | 5/1990 | Japan . |

OTHER PUBLICATIONS

Mariste Thomson, "In Situ End Point Control of Photoresist Development", May 1990, Solid State Technology.

Primary Examiner—D. Rutledge
Attorney, Agent, or Firm—Lewis H. Eslinger; Jay H. Maioli

[57] ABSTRACT

An image developing apparatus using a laser beam source to produce an original plate for producing a master disk of an optical type recording disk such as video disk and the like. A disk base plate 3 formed thereon with an exposed optically sensitive film 2 is rotated while developing solution 6 is supplied on the optical sensitive film 2 to remove the exposed parts of the film. To monitor the development, a laser beam 8 from a laser beam source 7 is irradiated on an exposed portion of the optical sensitive film 2 which is being dissolved and zero and first order diffraction light 9 and 10 are detected by first and second detectors 11 and 12. Light amount control element 13 are provided to maintain constant the detected level of zero order light by controlling the laser, and the first order light is used to detect a stop time for the development. Stabilization of the zero order light eliminates fluctuations from external sources such as dust, mist etc. The incident light may be controlled by the control element 13 either directly if a semiconductor laser is used or by using a modulator in the light path if a gas laser is used. The semiconductor laser may have a short coherence length which reduces fluctuations caused by multiple interference effects within the glass disk base plate 3 whose thickness can vary.

12 Claims, 6 Drawing Sheets

OUTPUT WAVEFORM

OUTPUT OF FIRST
PHOTOELECTRIC CONVERSION MEANS

OUTPUT WAVEFORM

OUTPUT OF SECOND
PHOTOELECTRIC CONVERSION MEANS

BLOCK DIAGRAM OF
CONVENTIONAL EXAMPLE

OUTPUT WAVEFORM

OUTPUT OF FIRST
PHOTOELECTRIC CONVERSION MEANS

PRINCIPLE OF
MULTI-MOVEMENT INTERFERENCE

OUTPUT WAVEFORM

OUTPUT OF SECOND
PHOTOELECTRIC CONVERSION MEANS

IMAGE DEVELOPMENT APPARATUS AND METHOD

DESCRIPTION OF THE INVENTION

1. Field of the Invention

The invention relates to an image developing equipment used when developing an original plate for producing a master disc of a so-called optical-type recording disk such as a video disk, an audio disk or the like.

2. Description of the Prior Art

An original plate (negative plate, original edition) of an optical type recording disk, in general, is produced by forming an optically sensitive film with a thickness of about 0.1 μm on a surface of the glass original plate by applying a photoresist layer, and after exposing the optically sensitive film to a laser or the like modulated by a recording signal by using a master code cutter etc, then the exposed portions of the film are eliminated in a chemical development process using image development equipment.

As shown in FIG. 5 of the accompanying drawings, it is well known from U.S. Pat. No. 4,469,424 for example, that a disk base plate 101 carrying the exposed optically sensitive film is rotated by a rotative drive means 102 while a developing solution is sprayed (supplied) thereon by a developing solution supply means 103. Further, while an exposed portion of the optically sensitive film is being dissolved to form the so-called pits, this exposed portion is irradiated by a monitor laser beam 105 from a He-Ne laser beam source 104. Light diffracted by the pit and which varies with the growth of the pit, i.e., zero order light and first order light 106 and 107, is detected by first and second photoelectric conversion means 108 and 109, and when the detected levels reach predetermined values the development process is interrupted (stopped), e.g. by stopping spray of the developing solution, so as to control the sectional size of the pits.

However, the image developing equipment as described above produces, as shown in FIG. 6, turbulence (pulsation) in outputs of the zero order light and the first order light because of external disturbances such as dust floating in the optical path of the laser beam, fog caused by spraying the developing solution, fluctuations of the developing solution surface, or variations in laser output and the like, therefore errors in development of the pits can be caused by errors in detecting the precise stop position of the developing process.

Furthermore, turbulence in the outputs of photoelectric conversion means 106 and 105 is also found to arise through unevenness of a thickness of the glass base plate 101. The surface of the glass base plate 101 appears to be flat, but actually on the surface exist an enormous number of irregularities, and accordingly it has been found that, when for such a glass base plate 101 the laser beam is irradiated on the photoresist film as a monitor light, then as shown in FIG. 7, diffracted light "b" of the monitor light "a" and diffracted light "c" reflected on a rear surface of the glass base plate are multi-interfered with each other to produce turbulence (pulsation) in the output of the second photoelectric conversion means 106 as shown in FIG. 8 (for example, when a glass base plate 101 has a refractive index n=1.5 and a laser wavelength=0.6328 μm, then the outputs of the photoelectric conversion means 106 and 105 increase or decrease every time a thickness "c" of the glass base plate varies by approximately 0.2 μm), this provides a further difficulty to exactly detect a stop position of the developing process, and results in fluctuations in the shapes of the pits.

OBJECTS AND SUMMARY OF THE INVENTION

An object of the present invention is to allow accurate detection of a stop position of the development process while avoiding being affected by disturbance from the exterior such as the dust floating in the optical path of the laser beam, the fog of developing solution, the fluctuation of the developing solution surface, and the like.

A further object of the invention is to allow formation of pits accurately whereby output turbulence of the photoelectric conversion means caused by an unevenness of thickness of the glass base plate is suppressed so that the stop position of the developing process is exactly detected.

According to a first aspect the present invention provides a method and apparatus for image developing in the above type of process in which the light amount of the laser beam irradiated on the optically sensitive film is controlled so as to stabilize the output of the light diffracted, preferably the zero order diffracted light, by the developing pits.

As the zero-order and first-order light are affected in the same way by disturbances, stabilization of the zero-order light by control of the incident light allows elimination of the effects of external disturbances such as fluctuation of the developing solution surface and the like.

The level of zero-order light may be stabilized to a substantially constant value or to a predetermined function of time through the developing process and taken into account by the control means monitoring the first order diffracted light to detect the stop point for the developing process.

The control may be effected on the laser source directly and in this case it is particularly advantageous to use a semiconductor laser. Alternatively a controllable modulator may be placed in the path of the light incident on the optically sensitive film.

According to a second aspect the invention contemplates an image developing method and equipment for use in the above type of process in which the laser beam has a decreased coherence length which is capable of preventing the diffraction light from the occurrence of multiple reflection within the disk base plate which through unevenness of thickness of the disk base plate can cause fluctuations. The coherence length is selected in accordance with the thickness of the plate and optical path difference of multiple reflections in the plate, and preferably factors which affect the optical path difference including the material of the plate, refractive index, laser wavelength, size of thickness variations etc.

The coherence length is substantially less than that of a gas laser, e.g. of He-Ne type, preferably less than 1 m, more preferably less than 10 cm, more preferably less than 1 cm.

The laser beam source is preferably a semiconductor laser as these have a suitable coherence length and thus the two aspects of the invention may advantageously be combined.

The invention will be further described by way of example in the following description of illustrative embodiments made with reference to the accompanying drawings.

DESCRIPTION OF PREFERRED EMBODIMENTS

Figure 1:
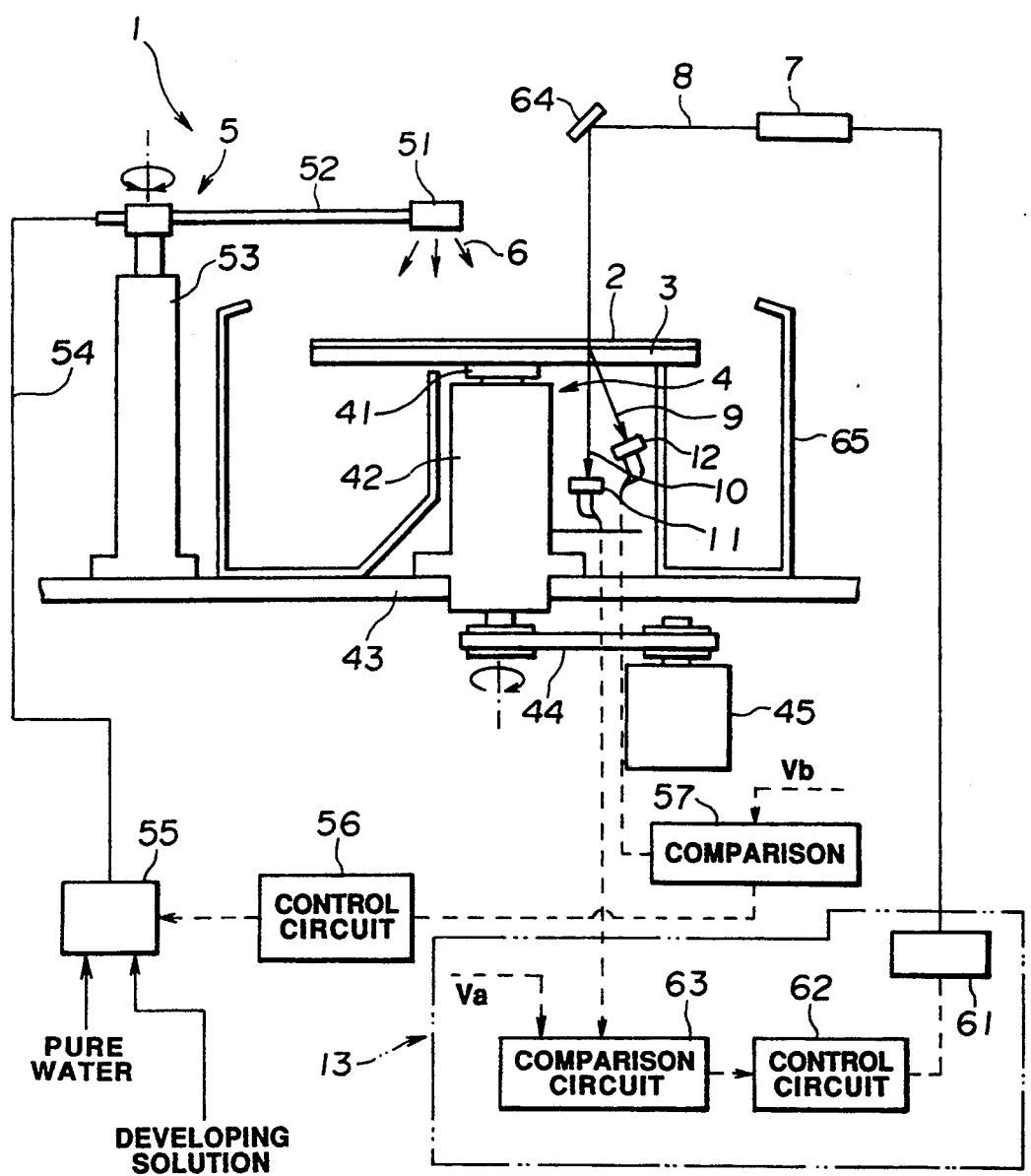
FIG. 1 is a block diagram of a first embodiment of the invention.

In FIG. 1, numeral 1 depicts an image developing equipment according to a first embodiment of the invention. The image developing equipment 1 is so constructed that a disk base plate 3 made of glass formed thereon with a photoresist film as an optically sensitive film 2 which has been exposed to a recording beam is rotated by a rotative drive means 4 in a chamber 65, while being sprayed and supplied thereon with development solution 6 by a developing solution supply means 5. As a result of this exposed portions of the optically sensitive film 2 are dissolved by the developing solution 6 to be formed into pits. The pits are irradiated by a monitor laser beam 8 from a laser beam source 7 and a zero order light 9 and a first order light 10 are detected by first and second photoelectric conversion means (detectors) 11 and 12 respectively, after which, based on a result of such detection the supply and spray of the developing solution 6 by the developing solution supply means 5 is stopped. Light amount control means 13 are provided in which outputs of the zero order light 9 and first order light 10 are kept at a stable state without turbulence by controlling an output of the laser beam source 7 even when dust floats in an optical path of the laser beam, a fog of developing solution develops, the developing solution surface fluctuates etc.

The rotative drive means 4 comprises a turntable 41 carrying the disk base plate 3 held by a vacuum, a spindle 42 attached to the turntable 41, a base plate 43 supporting the spindle 42, and a servomotor 45 for rotating the spindle 42 through a belt 44, where the disk base plate 3 is rotated by the servometer 45, through the belt 44, spindle 42, and turntable 41.

The developing solution supply means 5 comprises a nozzle 51 arranged above the turntable 41, a nozzle arm 52 attached at one end to the nozzle 51, an arm support table 53 for rotatably supporting the other end of the nozzle arm 52 and the nozzle 51 to a tube 54. It also comprises, a solenoid valve (a cross valve) 55 for supplying the developing solution or pure water to the nozzle 51 via tube 54 and arm 52, a control circuit 56 for controlling the solenoid valve 55, and a comparison circuit 57 connected to the control circuit 56.

The comparison circuit 57 is constructed to receive an output signal from the second optical conversion means 12, and has an arrangement that when the output signal reaches a developing stop level Vb, the solenoid valve 55 is operated to switch the control circuit 56 and to supply pure water instead of the developing solution, at which developing stops by spraying of the pure water on the optically sensitive film 2 to wash away the developing solution.

A semiconductor laser having a relatively short coherence length is used for the laser beam source 7, and the laser beam 8 with a short coherence length is adapted to irradiate, via a mirror 64, the photoresist film to monitor the development process.

Next, the light amount control means 13 will be described.

The light amount control means 13 comprises a laser driver 61 for controlling the laser beam source 7, a control circuit 62 for the laser driver 61, and a comparison circuit 63 connected to the control circuit 62 and receiving an output of the first photoelectric conversion means 11. The output of the semiconductor laser as a laser beam source 7 is controlled by the control circuit 62 and the laser driver 61 so that the output of the first optical conversion means 11 is kept at a stable condition irrespective of external disturbances as described above.

In operation the disk base plate 3 with the optically sensitive film 2 exposed by a master code cutter and the like, is placed on the turntable 41, which is rotated while pure water is sprayed from the nozzle 51 so as to wash the film 2.

After washing the nozzle arm 52 is rotated and then the nozzle 51 is stopped at a predetermined position on the optically sensitive film 2, and simultaneously the semiconductor laser irradiates the optically sensitive film 2.

Figure 2:
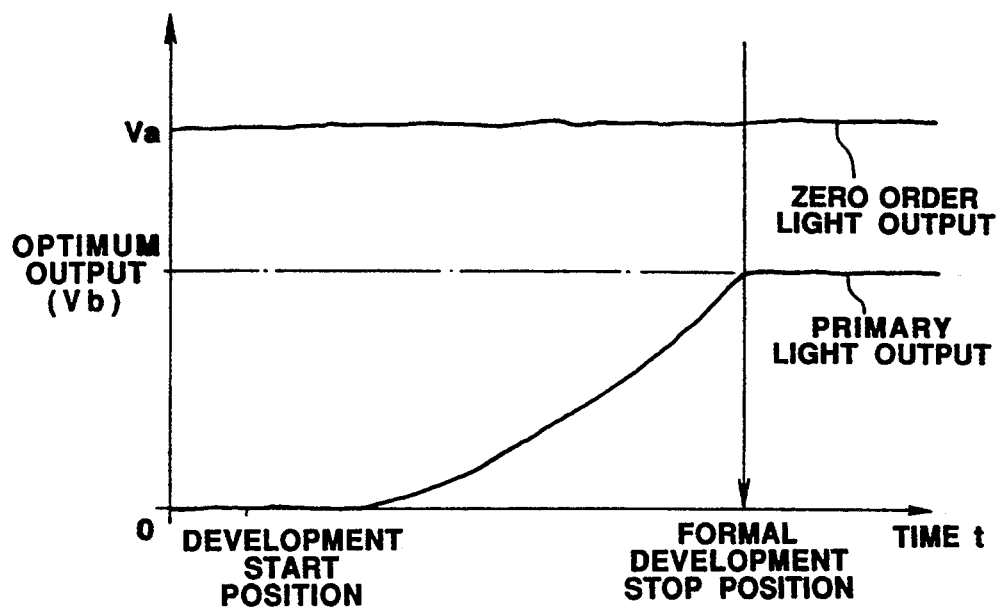
FIG. 2 shows an output waveform obtained with the FIG. 1 embodiment.

While the disk base plate 3 is rotated by the turntable 41, the developing solution 6 is sprayed from the nozzle 51 onto the optically sensitive film 2 and the spray of developing solution 6 erodes the exposed portions of the optical sensitive film 2 to start forming the pits. To produce a predetermined sectional size of the pit when an output of the second photoelectric conversion means 12 reaches a development stop level Vb, the solenoid valve 55 is operated to spray pure water from the nozzle 51 instead of the developing solution 6 so as to wash away the developing solution 6. During this process the light amount control means 13 consisting of the comparison circuit 63, control circuit 62, and laser driver 61 controls the output of the laser beam source 7, as shown in FIG. 2, to make the output of the zero order light 9 stable and therefore turbulence of output of the first order light 10 is suppressed enabling an accurate detection of a stop position of the developing process.

The use of the semiconductor laser which has a good control response characteristic as the laser beam source facilitates the direct control of the laser beam.

Figure 3:
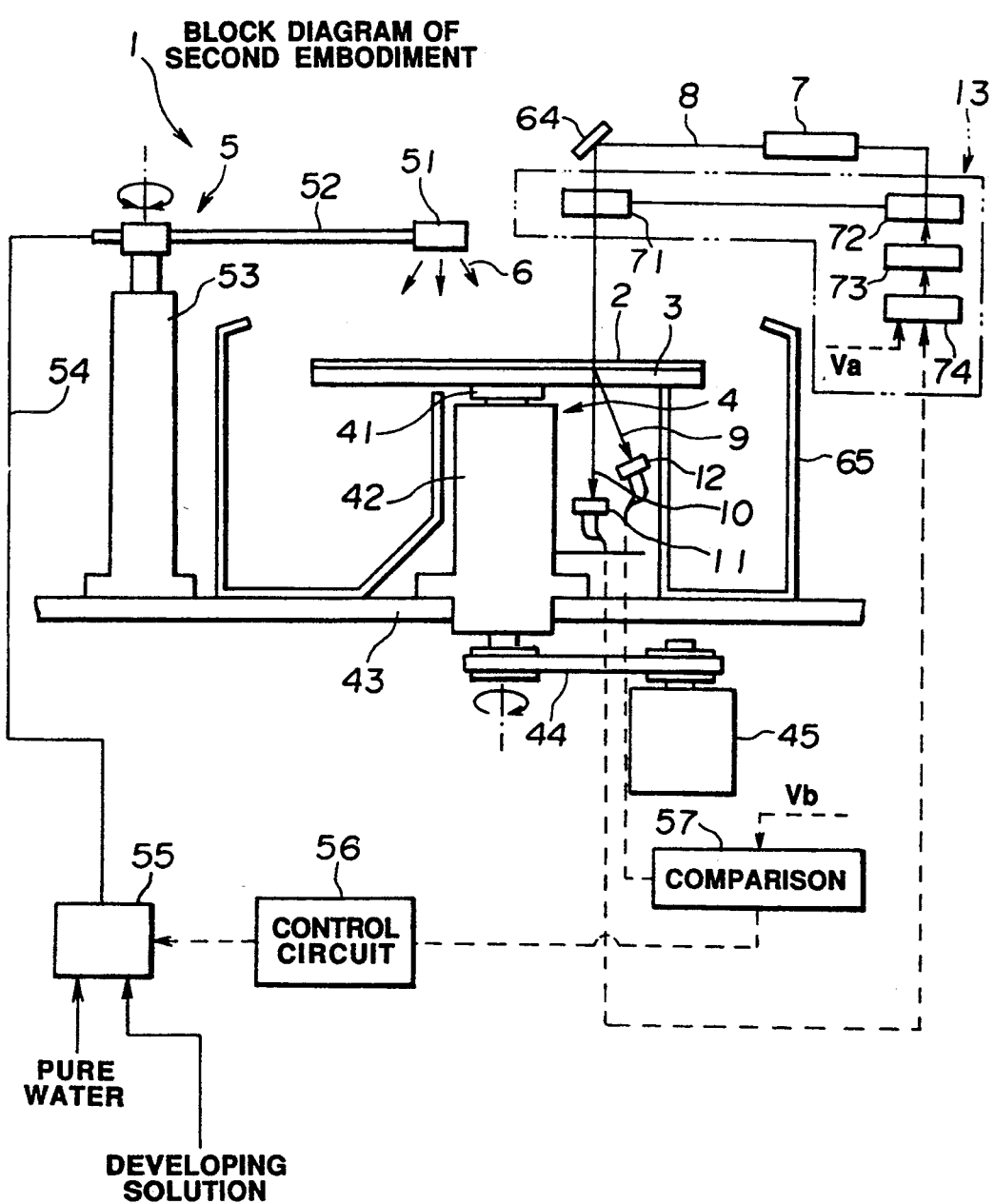
FIG. 3 is a block diagram of a second embodiment of the invention.

However, in an alternative embodiment as shown in FIG. 3 which uses a less responsive laser such as a He-Ne laser, the light amount control means 13 comprises a modulator (E.O modulators) 71 provided in the optical path of the laser beam emitted from the laser beam source 7, a modulator driver 72 for controlling the modulator 71, a control circuit 73 for the modulator driver 72, and a comparison circuit 74 connected to the control circuit 73 and receiving an output of the first photoelectric conversion means 12. With this arrangement, even when there is a possibility of turbulence in the diffraction light because of external disturbances, then it controls the modulator 71 by using the comparison circuit 74, control circuit 73, and modulator driver 72, to further control an output from the modulator 71, this thus permits an accurate detection of the stop position of the image developing process with a stable output of the zero order light as is the case of a direct control of the output of the laser beam source 7.

Figure 4:
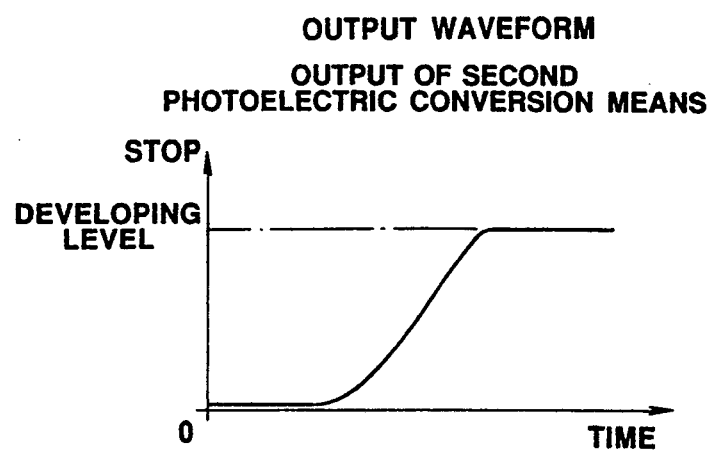
FIG. 4 is a further output waveform of the FIG. 1 embodiment.
Figure 5:
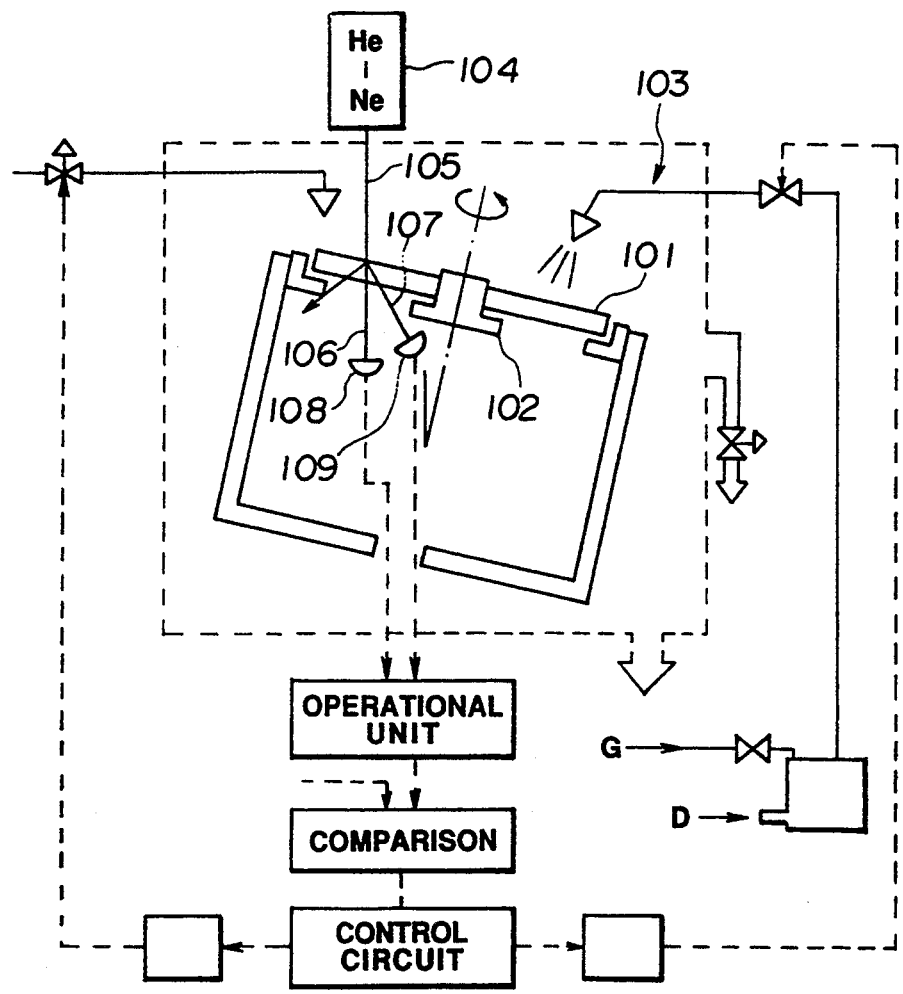
FIG. 5 is a block diagram of a conventional apparatus.
Figure 6:
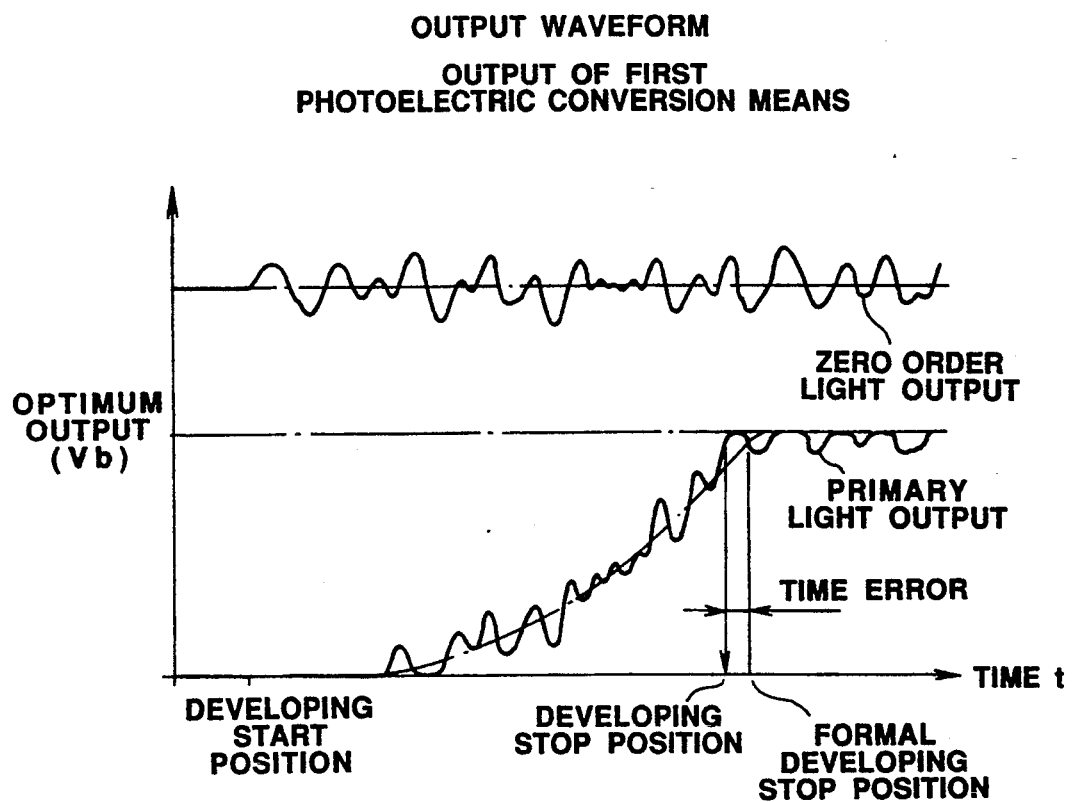
FIG. 6 shows an output waveform of such conventional apparatus.
Figure 7:
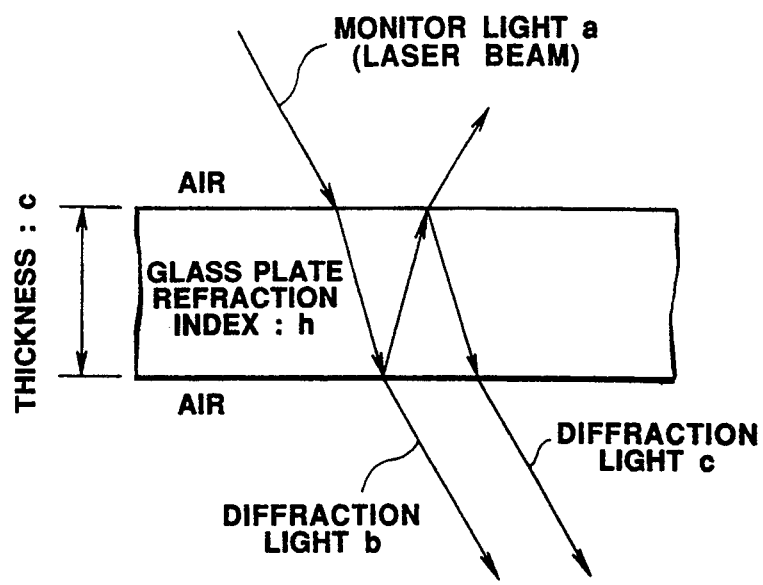
FIG. 7 is a diagram of an effect obtained with the conventional apparatus.
Figure 8:
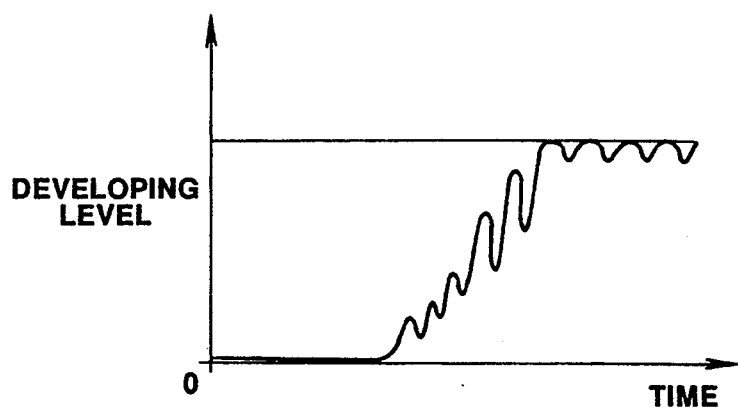
FIG. 8 is a diagram of a corresponding output waveform.

In the embodiment of FIG. 1 the optically sensitive film 2 and the disk base plate 3 are irradiated by a laser beam from a semiconductor laser 7 which has a relatively short coherence length. This means that no multiple interference arises in the diffraction light 9 and 10 even when the thickness of the disk base plate 3 is uneven. This therefore reduces turbulence in the output waveform from the second photoelectric conversion means 12 as shown in FIG. 4, and it becomes possible to more exactly detect the developing stop level Vb.

Also the use of the semiconductor laser as a laser beam source 7 reduces the necessity for a laser replacement due to its longer life (semi-eternal) compared to gas lasers such as He-Ne lasers and the like, and it thus avoids the complicated time-consuming work for determining conditions for an output of the photoelectric conversion means and for forming optimum bits respectively in a laser exchange. Furthermore, smaller laser heads can be employed also advantageously permitting an improvement of freedom in design with a compact size with lower cost.

We claim:

1. Image developing apparatus for processing a disk base plate carrying an optically sensitive film having portions exposed by a recording beam for use in producing optical master disks, comprising a drive means for rotating the disk base plate, development solution supply mean for supplying developing solution onto the optically sensitive film while the disk base plate is rotated by the drive means to dissolve the exposed portions of the optically sensitive film, a laser beam source for irradiating dissolved exposed portions during supply of developing solution, photoelectric conversion means for detecting zero and first order diffracted light from the dissolved exposed portions, and control means responsive to the photoelectric conversion means to stop supply of developing solution based on the detection of the diffracted light, wherein the control means further comprises light amount control means for controlling the intensity of the laser beam irradiated on the optically sensitive film in dependence upon the detected level of the zero-order diffracted light.

2. Image developing apparatus according to claim 1 wherein the light amount control means is adapted to maintain the level of zero-order diffracted light substantially constant.

3. Image developing apparatus as claimed in claim 1, wherein the light amount control means comprises a laser driver for controlling an output of the laser beam source, a control circuit for the laser driver, and a comparison circuit having an output connected to the control circuit and receiving as an input an output of the photoelectric conversion means.

4. An image developing equipment as claimed in claim 1, wherein the light amount control means comprises a modulator provided in the optical path of the laser beam from the laser beam source to the optically sensitive film, a modulator drive for controlling the modulator, a control circuit for the modulator driver, and a comparison circuit having an output connected to the control circuit and receiving as an input an output of the photoelectric conversion means.

5. An image developing method for use in processing a disk base plate carrying an optically sensitive film having portions exposed by a recording beam for use in producing optical master disks, comprising the steps of rotating the disk base plate and concurrently supplying a developing solution onto the optically sensitive film to dissolve the exposed portions of the optically sensitive film, irradiating an exposed portion of the optically sensitive film while being dissolved by the developing solution, and detecting levels of zero an first-order light diffracted from the exposed portion, and stopping the supply of developing solution in dependence on the detected levels of diffracted light, wherein the method further includes the step of controlling the intensity of the laser beam irradiated on the optically sensitive film in dependence upon the level of the diffracted zero-order diffracted light.

6. Image developing apparatus for processing a disk base plate carrying an optically sensitive film having portions exposed by a recording beam for use in producing optical master disks, comprising a drive means for rotating the disk base plate, development solution supply means for supplying developing solution onto the optically sensitive film while the disk base plate is rotated by the drive means to dissolve the exposed portions of the optically sensitive film, a laser beam source for irradiating dissolved exposed portions during supply of developing solution, photoelectric conversion means for detecting diffracted light from the exposed portion, and control means responsive to the photoelectric conversion means to stop supply of developing solution based on a result of the detection of the diffracted light, wherein the laser beam source comprises a source of laser light having a coherence length that is sufficiently short compared to a thickness of said disk based plate such that interference resulting from occurrence of multiple reflection in the disk base plate is prevented.

7. Image developing apparatus according to claim 6 wherein the laser source is a source of laser light having a coherence length selected in relation to the optical path difference between beams multiply reflected inside the disk base plate.

8. Image developing apparatus according to claim 6 wherein the laser beam source is a semiconductor laser.

9. Image developing apparatus according to claim 6 wherein the coherence length of the laser is substantially less than 1 m.

10. Image developing apparatus according to claim 6 wherein the coherence length of the laser is substantially less than 10 cm.

11. Image developing apparatus according to claim 6 wherein the coherence length of the laser is substantially less than 1 cm.

12. An image developing method for use in processing a disk base plate carrying an optically sensitive film, having portions exposed by a recording beam for use in producing optical master disks, comprising the steps of rotating the disk base plate and concurrently supplying a developing solution onto the optically sensitive film to dissolve the exposed portions of the optically sensitive film, irradiating the exposed portions of the optically sensitive film while being dissolved by the developing solution, detecting light diffracted from the exposed portion, and stopping the supply of developing solution in dependence on the detected level of diffracted light, the method further including the step of selecting the laser beam source in accordance with the thickness of the disk base plate such that the coherence length of the laser is sufficiently short compared to the said thickness to prevent generation of interference by multiply reflected light within the disk base plate.

* * * * *